(12) United States Patent
Akimoto

(10) Patent No.: US 7,292,348 B2
(45) Date of Patent: Nov. 6, 2007

(54) STAGE APPARATUS INCLUDING A CORRECTION UNIT TO CORRECT A WAVELENGTH VARIATION OF MEASUREMENT LIGHT BASED ON MEASURED DISPLACEMENT OF A STAGE

(75) Inventor: Satoshi Akimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 22 days.

(21) Appl. No.: 11/248,226

(22) Filed: Oct. 13, 2005

(65) Prior Publication Data

US 2006/0082784 A1    Apr. 20, 2006

(30) Foreign Application Priority Data

Oct. 19, 2004    (JP) .............................. 2004-304343

(51) Int. Cl.
*G01B 9/02*    (2006.01)
(52) U.S. Cl. ..................................... 356/498
(58) Field of Classification Search .............. 355/75, 355/72, 53; 356/514, 500, 498, 511, 508, 356/493, 486
See application file for complete search history.

(56) References Cited

U.S. PATENT DOCUMENTS

| | | | |
|---|---|---|---|
| 6,043,500 A | 3/2000 | Akimoto | 250/548 |
| 6,359,688 B2 | 3/2002 | Akimoto et al. | 356/401 |
| 6,567,154 B2 | 5/2003 | Akimoto | 355/53 |
| 6,819,433 B2 | 11/2004 | Takal et al. | 356/500 |
| 6,864,963 B2 * | 3/2005 | Chen et al. | 355/75 |
| 7,042,576 B2 * | 5/2006 | Hattori | 356/500 |
| 2003/0142321 A1 * | 7/2003 | Hattori | 356/500 |
| 2005/0083501 A1 | 4/2005 | Akimoto | 355/53 |
| 2005/0190375 A1 | 9/2005 | Akimoto | 356/500 |

FOREIGN PATENT DOCUMENTS

JP    2002-319541    10/2002

* cited by examiner

*Primary Examiner*—Hwa (Andrew) Lee
(74) *Attorney, Agent, or Firm*—Fitzpatrick, Cella, Harper & Scinto

(57) ABSTRACT

A stage apparatus including a stage capable of moving an object, first and second measurement units adapted to measure a displacement of the stage in a predetermined direction based on a variation of an optical path length of measurement light, which are arranged so as to have an overlap area to simultaneously measure a stage position while the stage is being moved, a switching unit to switch measurement by the first measurement unit to measurement by the second measurement unit by delivering a measurement value from the first measurement unit to the second measurement unit in the overlap area, and a correction unit, in the stage position upon switching by the switching unit, to correct a wavelength variation of the measurement light based on the measurement value delivered from the first measurement unit to the second measurement unit.

8 Claims, 9 Drawing Sheets

STAGE APPARATUS INCLUDING A CORRECTION UNIT TO CORRECT A WAVELENGTH VARIATION OF MEASUREMENT LIGHT BASED ON MEASURED DISPLACEMENT OF A STAGE

FIELD OF THE INVENTION

The present invention relates to a position measuring technique for a stage apparatus for holding an object by moving the object, and, more particularly, to a position measuring technique for a stage apparatus placed in a semiconductor exposure apparatus.

BACKGROUND OF THE INVENTION

An exposure apparatus, utilized in the fabrication of semiconductor devices, liquid crystal display devices, and the like, has a stage apparatus to move an original plate, such as a mask or a reticle, or an exposed substrate, such as a semiconductor wafer or a glass substrate.

In this stage apparatus, generally, a laser interferometer and a reflecting mirror are used for stage position measurement.

Japanese Patent Application Laid-Open No. 2002-319541 discloses an apparatus having plural laser interferometers for stage position measurement. The position measurement is performed by selectively using the plural laser interferometers.

On the other hand, in the laser interferometer, a laser wavelength changes due to slight variations of air pressure, temperature and humidity, and causes a measurement error. Accordingly, the exposure apparatus is placed in a chamber for environmental control. At the same time, regarding the remaining variations, the wavelength is corrected with measurement values from an air pressure gauge, a temperature gauge, a humidity indicator, and the like.

When the position measurement is performed by selectively using plural laser interferometers, it is necessary to prevent occurrence of displacement before and after changing of an interferometer. For this purpose, it is necessary to provide overlapping sections where plural laser interferometers are able to measure and to inherit a prior measurement value before changing of the interferometer.

The wavelength correction described above is performed with an optical path length of a laser interferometer, the base point being determined upon being reset. In a stage apparatus in which the interferometer is not changed, wavelength correction is performed after the start of the apparatus, unless the apparatus is stopped due to an error, or the like. However, in a case wherein the interferometer is changed or interrupted, i.e., when a laser interferometer, which was light-shielded and disabled and has been brought online, the laser interferometer is reset each time. In the above case, as an XYZ position varies, the optical path length as a base point of the wavelength correction also varies. Without consideration of the amount of variation, a measurement error causes a displacement.

SUMMARY OF THE INVENTION

The present invention has been made in consideration of the above problems, and has as its object to reduce a stage displacement caused upon changing of a measuring unit, such as a laser interferometer.

According to one aspect of the present invention, there is provided a stage apparatus comprising a stage capable of moving an object, first and second measurement units adapted to measure a displacement of the stage in a predetermined direction based on a variation of an optical path length of measurement light, being arranged so as to have an overlap area to simultaneously measure a stage position while the stage is being moved, a switching unit adapted to switch measurement by the first measurement unit to measurement by the second measurement unit by delivering a measurement value from the first measurement unit to the second measurement unit in the overlap area, and a correction unit adapted, in the stage position upon switching by the switching unit, to correct a wavelength variation of the measurement light based on the measurement value delivered from the first measurement unit to the second measurement unit.

According to another aspect of the present invention, there is provided a position measurement method for a stage apparatus having a stage capable of moving an object, and first and second measurement units adapted to measure a displacement of the stage in a predetermined direction based on a variation of an optical path length of measurement light, being arranged so as to have an overlap area to simultaneously measure a stage position while the stage is being moved, the method comprising a switching step of switching measurement by the first measurement unit to measurement by the second measurement unit by delivering a measurement value from the first measurement unit to the second measurement unit in the overlap area, and a correction step of, in the stage position upon switching at the switching step, correcting a wavelength variation of the measurement light based on the measurement value delivered from the first measurement unit to the second measurement unit.

According to the present invention, the wavelength correction of the laser interferometer before measurement unit changing can be inherited, and a displacement due to the changing of interferometer can be reduced.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

Hereinbelow, an embodiment of the present invention will be described in detail with reference to the accompanying drawings.

Note that the following embodiment is an example of implementation of the present invention, and can be appropriately corrected or changed in accordance with the construction and various conditions of an apparatus to which the present invention is applied.

Further, the present invention is also achieved by supplying a storage medium (or recording medium) holding software program code to realize a stage position measurement method and a wavelength correction method, a device fabrication method, and the like, to be described later to a system or apparatus, then reading the program code from the storage medium by a computer (or CPU or MPU) of the system or apparatus, and executing the program.

Figure 1:
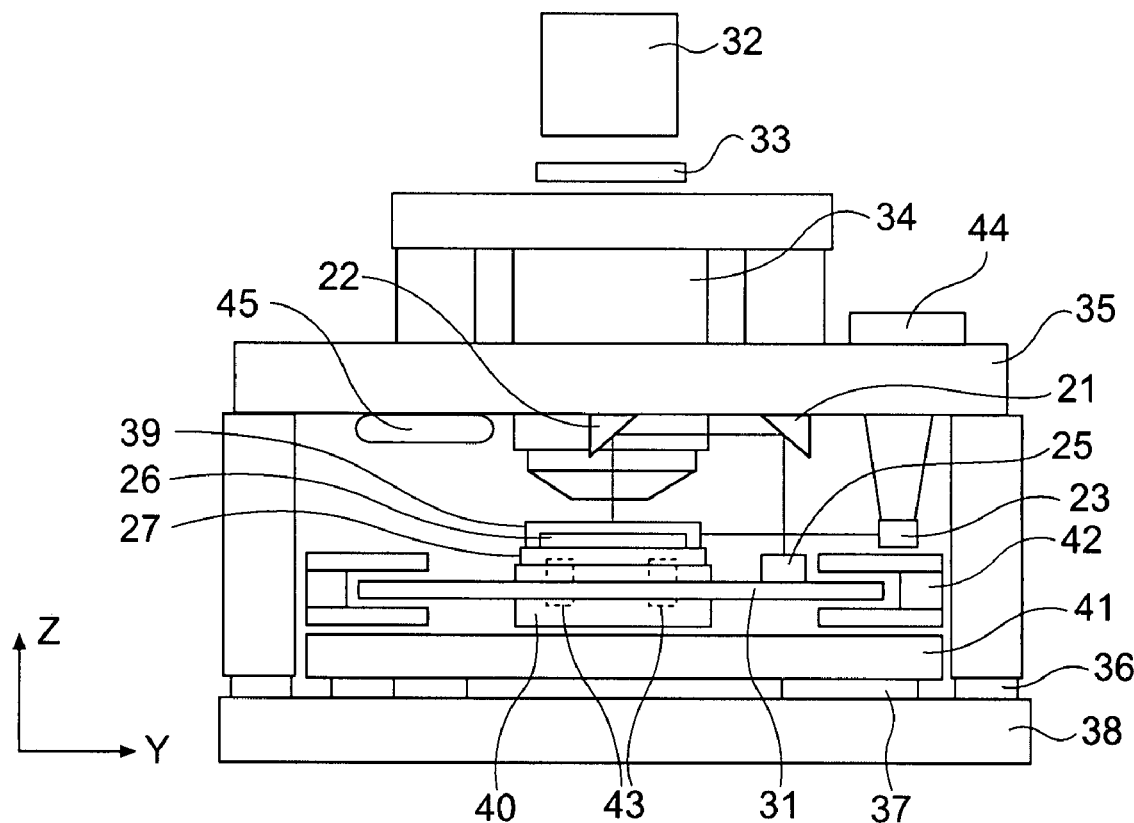
FIG. 1 is a schematic front view of an exposure apparatus according to an embodiment of the present invention.

FIG. 1 is a schematic front view of an exposure apparatus according to a first embodiment of the present invention.

In FIG. 1, reference numeral 32 denotes an illumination unit to illuminate a reticle as an original plate; 33, a reticle having a pattern to be transferred; 34, a projection lens (projection optical system) to project the pattern formed on the reticle 33 onto a wafer as a substrate; 35, a lens barrel support member to support the lens 34; 36, an active mount for a main body (lens barrel support member) to support the lens barrel support member 35 to suppress vibration and to insulate vibration from a floor; and 38, an alignment base on which the main body active mount 36 and an active mount 37 for a stage are placed.

Numerals 21 and 22 denote fixed mirrors for Z-measurement fixed to the lens barrel support member 35; and 39, a movable mirror for Z-measurement having two reflecting surfaces, integrated with an X mirror 29, to be described later.

Numeral 31 denotes an X stage movable in an X-direction; 40, a Y stage movable in a Y-direction with respect to the X stage 31; and 41, a stage base to support the Y stage 40 and the X stage 31. The stage active mount 37 suppresses vibration of the stage base 41 caused by movement of the stages and insulates vibration from the floor. Note that the X stage 31 and the Y stage 40 are supported with the stage base 41 in a non-contact state by hydrostatic bearings (not shown).

Numeral 42 denotes an X linear motor for driving to move the X stage 31 in the X-direction. In the X linear motor 42, a movable member is provided on the X stage 31 and a fixed member is provided on the stage base 41. Note that the fixed member of the X linear motor 42 may be supported on the stage base 41 in a non-contact state by a hydrostatic bearing (not shown), or may be fixed on the stage base 41. Further, a Y linear motor (not shown) for driving moves the Y stage 40 in the Y-direction. The Y linear motor, having a movable member provided on the Y stage 40 and a fixed member provided on the X stage 31, generates a driving force in the Y-direction between the X stage 31 and the Y stage 40.

Numeral 23 denotes a laser interferometer to measure a relative position between the lens barrel support member 35 and a top stage 27 for a substrate in the X-direction and to measure the attitude of the top stage 27. Further, a laser interferometer 24 (not shown) is used for measurement in the X-direction and measurement of the attitude of the top stage 27.

Numeral 25 denotes a laser interferometer on the X stage 31 to measure a distance between the lens barrel support member 35 and the movable mirror 39 on the top stage 27 and to calculate the position of the top stage 27 in the Z-direction.

Note that the top stage 27 is mounted on the Y stage 40, and is slightly moved by an actuator (not shown) with respect to the Y stage 40. Further, the top stage 27 is measurable by Z displacement sensors 43 provided in the Y stage 40. The Z displacement sensors 43 are sensors, such as linear encoders or electrostatic capacitance sensors, provided in addition to the Z-interferometer 25. The Z displacement sensors 43 measure displacements of the top stage 27 with respect to the Y stage 40 in three positions (the third position is not shown), thereby measuring displacements of the top stage 27 in the Z-direction and an inclination (tilt) direction.

Numeral 26 denotes a wafer chuck (substrate holder) to hold a semiconductor substrate (wafer) (not shown) coated with a photosensitive material as a subject of pattern projection. The top stage 27 is a θZ-stage to align the wafer chuck 26 in the Z-, θ-. ωX- and ωY-directions.

Numeral 44 denotes an air pressure gauge to measure an air pressure in the apparatus; 45, a wavelength correction unit to measure the amount of variations of wavelengths of laser interferometers. The wavelength correction unit 45 detects wavelength variations by continuously measuring the inside of the lens barrel having a fixed optical path length using a laser interferometer. These units are employed for wavelength correction of the laser interferometers in the apparatus.

Figure 2:
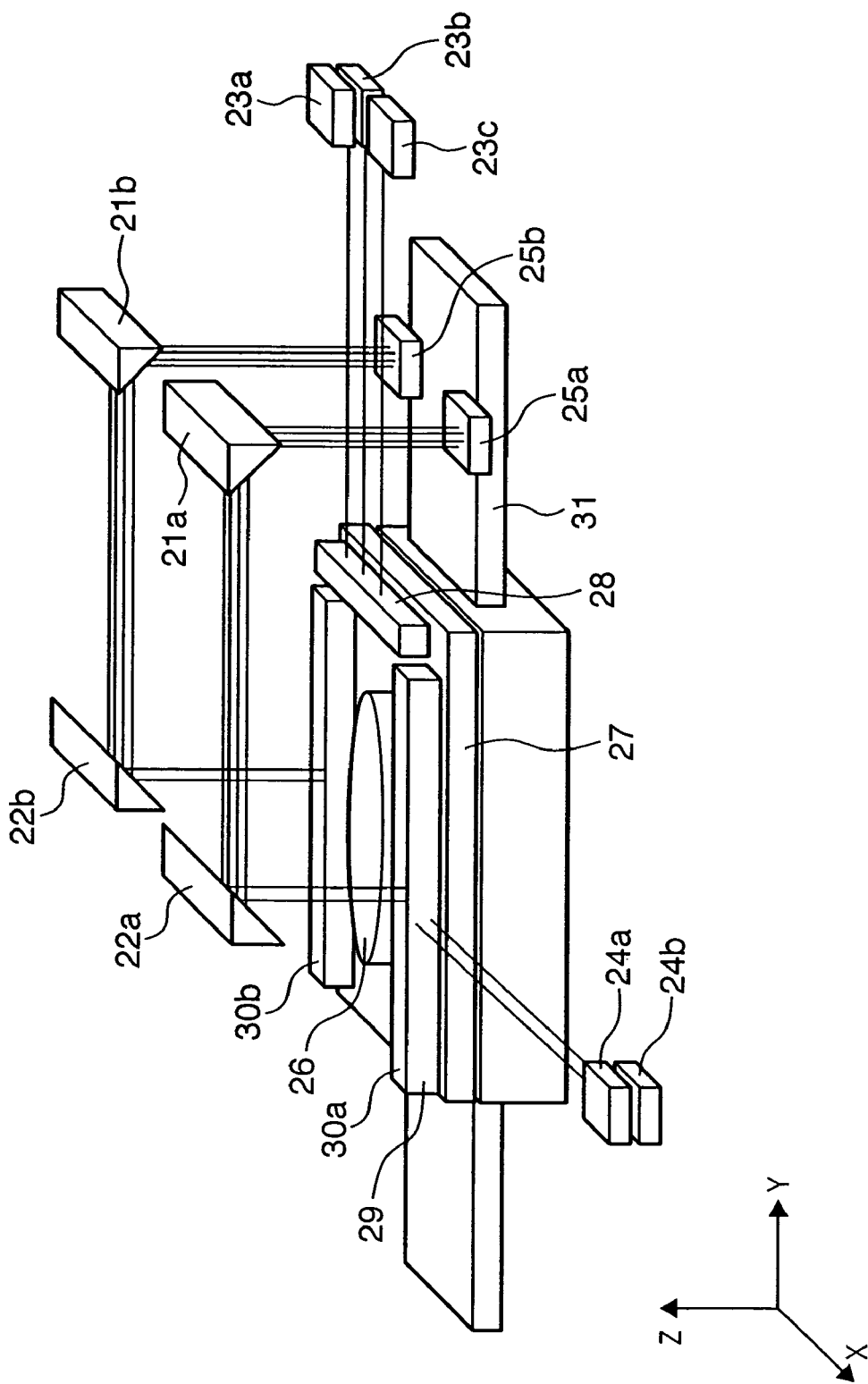
FIG. 2 is a schematic perspective view showing a case wherein measurement by selective use of interferometers according to the embodiment is applied to a Z-direction.

FIG. 2 shows the arrangement of an interferometer system to measure the position or displacement of the top stage 27 by the laser interferometers 23 and 24 and a Z-measurement laser interferometer 25. In FIG. 2, the wafer chuck 26 holds a wafer (not shown). The top stage 27, which supports the wafer chuck 26, is moved by a long stroke in the X- and Y-directions, and moved in the X-, ωX-, ωY- and θ-rotational directions by a short stroke, with a guide and an actuator (both not shown).

Numeral 28 denotes a Y mirror attached to the top stage 27. The X mirror 29 is also attached to the top stage 27. Numeral 30 denotes a Z mirror integrally provided with an upper surface of the X mirror 29. The Y mirror 28 is arranged with its reflecting surface vertical to the Y-direction, the X mirror 29, with its reflecting surface vertical to the X-direction; and Z mirror 30, with its reflecting surface parallel to an XY-plane.

Numerals 23a to 23c denote Y interferometers for measurement in the Y-direction, which respectively input a laser beam parallel to the Y-direction in a predetermined position of the reflecting surface of the Y mirror 28, and detect displacement information along a beam incidence direction (Y-direction) from reflected light. Numerals 24a and 24b denote X interferometers for measurement in the X-direction, which respectively input a laser beam parallel to the X-direction in a predetermined position of the reflecting surface of the X mirror 29, and detect displacement information along a beam incidence direction (X-direction) from reflected light.

The interferometers 23 and 24 are respectively fixed with a support member (not shown) as a measurement reference. For example, the interferometers 23 and 24 are fixed with the lens barrel support member as a structure integral with the projection optical system 34.

Numerals 25a and 25b denote Z interferometers for measurement in the Z-direction, mounted on the X stage 31, respectively arranged to output a beam vertically to the XY-plane, otherwise, arranged such that the beam is refracted to be vertical to the XY-plane with optical devices, such as mirrors. The interferometers 25a and 25b respectively output the beam to the reflecting surface of the Z mirror 30 parallel to the ZY-plane attached to the top stage 27, via the mirrors 21 and 22 attached to the lens barrel support member 35, thereby to measure the position of the top stage 27 in the Z-direction.

The first mirror 21 and the second mirror 22 guide output light from the Z interferometers 25 to the Z mirror 30. The mirrors 21 and 22 are fixed with their reflecting surfaces at an acute angle to the lens barrel 35 as a measurement reference or measurement light from the Z interferometer 25. The first mirror 21 and the second mirror 22 are long mirrors along a stroke direction (X-direction) of the movable member (Z stage 31) where the Z interferometer 25 is arranged.

In the exposure apparatus as shown in FIG. 1, a lens barrel is at the center of the lens barrel support member 35. Further, the wafer chuck 26 is mounted on the top stage 27. In this structure, a layout is limited not to block a measuring optical path from the Z interferometer 25. Further, in a case wherein the top stage 27 has a long-stroke movable range, to perform the Z-directional measurement in the entire stroke range, the mirrors 21, 22 and 30 are also moved by a long stroke. However, such elongated mirrors cause the following trouble.

(1) It is difficult to realize a high-accuracy flatness in terms of process and attachment.

(2) Even if the above flatness can be realized, the cost is high.

(3) The reduction of the characteristic value of the reflecting mirror degrades the control band.

Accordingly, in the present embodiment, the position of the top stage 27 can be measured while switching is made between two Z interferometers 25a and 25b in correspondence with an X-coordinate of the top stage 27, thereby the measuring can be made by avoiding an obstacle to block measuring light as well as the lens barrel. The switching is made with delivery of a measurement value from a previously-used interferometer to the succeeding interferometer by a controller (not shown). Upon switching, the stage is positioned in a measurement area where measurement by the two interferometer systems overlap each other. The overlap measurement area is designed in consideration of a switching period such that switching can be performed even when the stage is being moved.

The Z-directional position of the top stage 27 is measured by integrating a displacement amount obtained by the laser interferometer 25a or 25b into an initial position of the top stage 27 stored in the above-described controller. In a laser interferometer, its laser wavelength changes due to slight variations of air pressure, temperature and humidity, and causes a measurement error. Accordingly, the wavelength is corrected by the controller using measurement values from an air pressure gauge, a temperature gauge, a humidity indicator, and the like.

Next, a wavelength correction method in a case wherein the interferometer switching is performed will be described with reference to FIGS. 3A to 3D to FIG. 6. In the present embodiment, the correction is made using an air pressure gauge. However, the method is also applicable to the cases of a temperature gauge, a humidity indicator, and the like.

FIGS. 3A to 3D schematically show the Z interferometer system. Numerals 50a and 50b denote laser interferometers for measurement in the Z-direction, which measure the position of a Z mirror (not shown) attached on the top stage 27. The laser interferometers 50a and 50b correspond to the interferometers 25a and 25b in FIG. 2. In this example, the mirrors 21a and 21b, 22a and 22b on the optical path are not shown for the sake of convenience. When the apparatus is started, the top stage 27 performs a mechanical butting against the Y stage 40 with the actuator provided between the top stage and the Y stage. Then, in a butting position (origin position in FIGS. 3A to 3D), the interferometer 50b is reset (the value is set to "0"), and, at the same time, the value of an air pressure gauge 44 is sampled, and the wavelength correction unit 45 is reset. The resetting is made so as to perform wavelength correction with the reset time of the interferometer 50b (time t=t0) as a base point. In this example, the optical path length to the top stage 27 upon reset of the interferometer 50b (fixed value assured as a mechanical design value) is Zi(t0), and a wavelength correction coefficient obtained from an air pressure value indicated by the air pressure gauge 44 is Wi(t0). Further, a variation amount, of the wavelength correction coefficient obtained from an output from the wavelength correction unit 45 at time t, with the time t0 as a base point, is W(t). In the present embodiment, the absolute value Wi(t0) of the wavelength correction coefficient when t=t0 holds is obtained from the air pressure value from the air pressure gauge 44, and a relative value W(t) from the time point is obtained from the output from the wavelength correction unit 45. The absolute value of the wavelength correction coefficient at time t can be calculated by adding W(t) to Wi(t0). Wavelength correction coefficients at respective time points may be obtained only using the air pressure gauge without the wavelength correction unit. In such a case, the correction accuracy can be improved by using an air pressure gauge with a short sampling period for higher level realtime measurement.

Figure 3A:
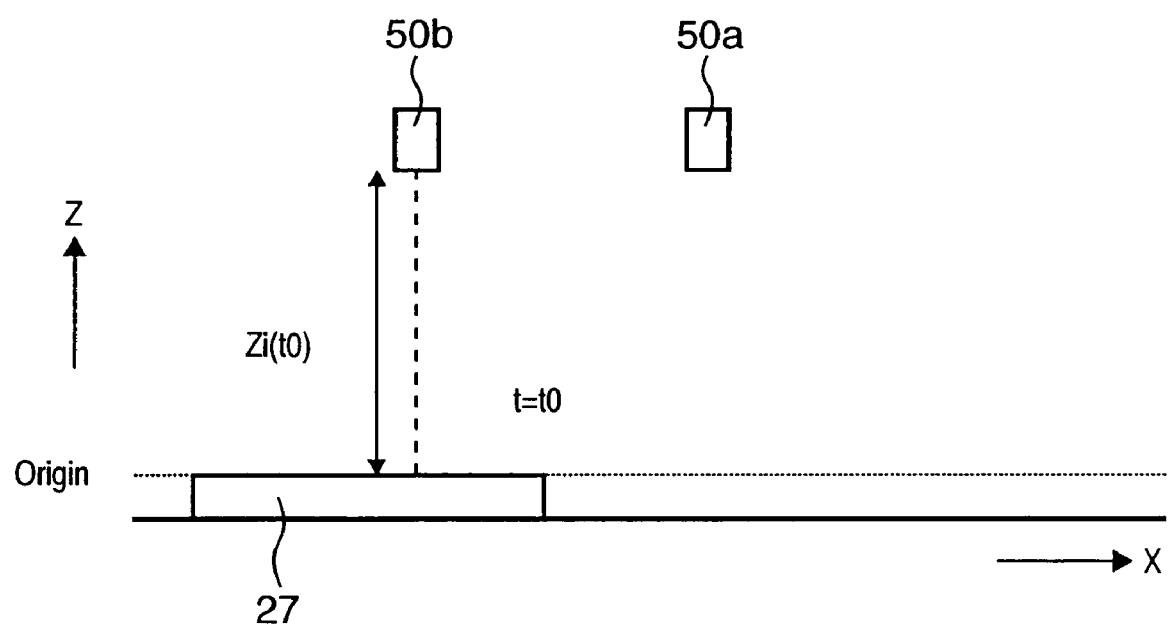
FIGS. 3A to 3D are explanatory views showing a wavelength correction method according to the embodiment.
Figure 3B:
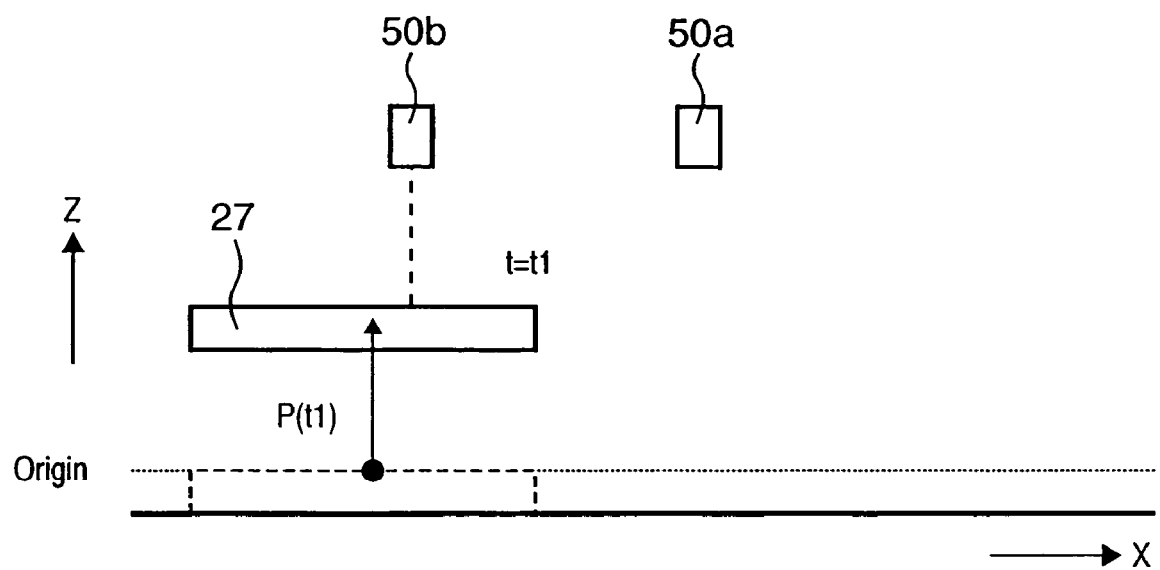

FIG. 3B schematically shows the top stage 27 at time (t=t1) driven from the status in FIG. 3A in the Z-direction by P(t1) in accordance with an output value from the interferometer 50b. At this time, a position correction amount $\Delta P(t1)$ is expressed as follows.

$$\Delta P(t1) = k1 * Zi(t0) + k2 * P(t1) \quad k1 = W(t1), k2 = Wi(t0) + W(t1) \quad (1)$$

The value k1 is a relative value of the wavelength correction coefficient from time t0 to t1, and the value k2 is an absolute value of the wavelength correction coefficient at t1.

Accordingly, the position P(t1)' of the top stage 27 after the wavelength correction is expressed as follows.

$$P(t1)' = P(t1) + \Delta P(t1) \quad (2)$$

Figure 4:
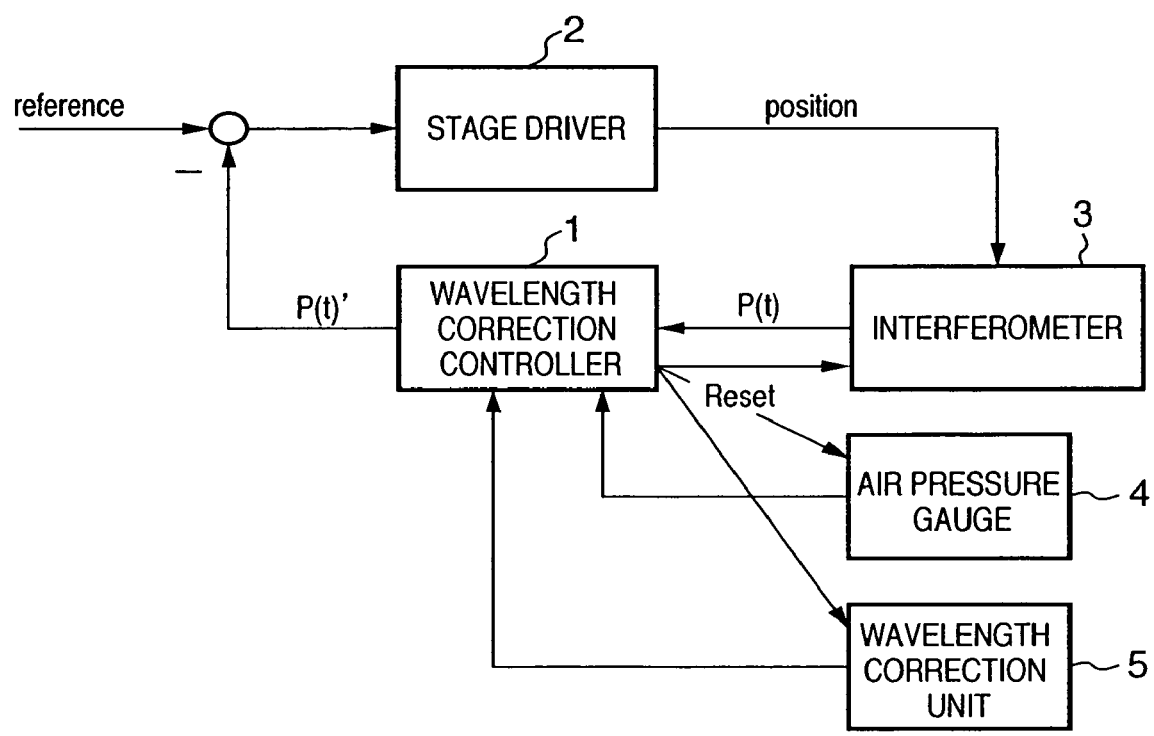
FIG. 4 is a block diagram showing a wavelength correction controller according to the embodiment.

These calculations are performed by a wavelength correction controller 1 as shown in FIG. 4. A stage driver 2 performs driving in accordance with a reference (target value). The position of the stage (current value) is measured by an interferometer 3, and outputted to the wavelength correction controller 1. The wavelength correction controller 1 performs a wavelength correction calculation based on the output from an air pressure gauge 4 and a wavelength correction unit 5, and feeds back a corrected current value to the stage driver 2.

Figure 3C:
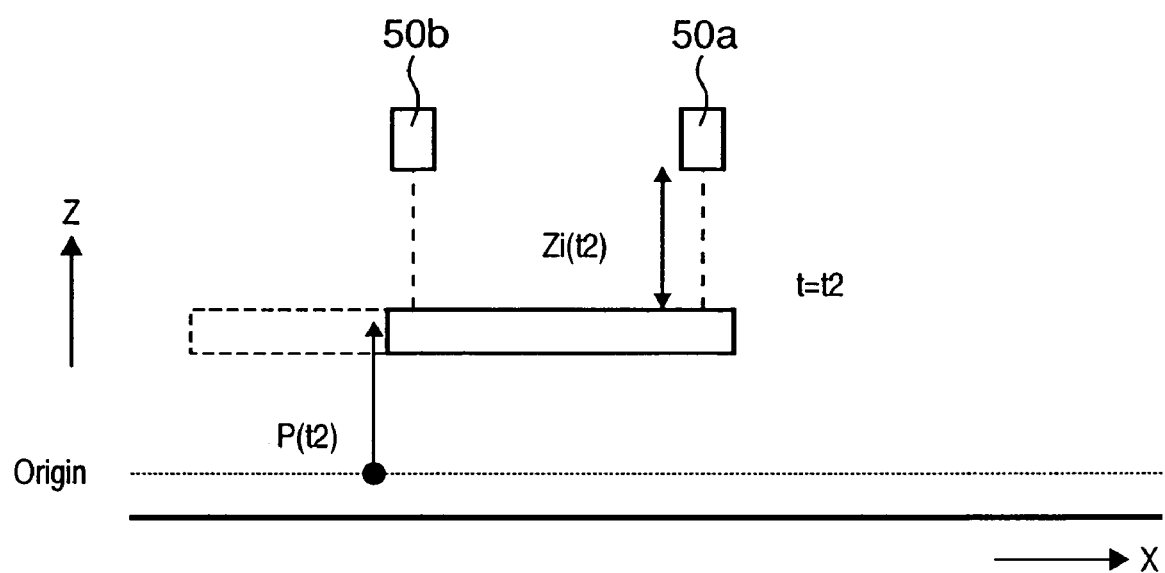

FIG. 3C schematically shows the top stage 27 at a time (t=t2) driven from the status in FIG. 3B in the X-direction, and interferometer switching is performed. The Z position P(t2) may be different from that shown in FIG. 5. At this time, as the interferometer 50a is enabled to perform measurement, as well as the interferometer 50b, a value P(t2) of the interferometer 50b is preset in the interferometer 50a, and the Z-positional measurement and control using the interferometer 50b are switched to those using the interferometer 50a. Further, the wavelength correction controller 1 holds wavelength correction coefficient variation amount W(t2) from time t0 to t2.

Figure 3D:
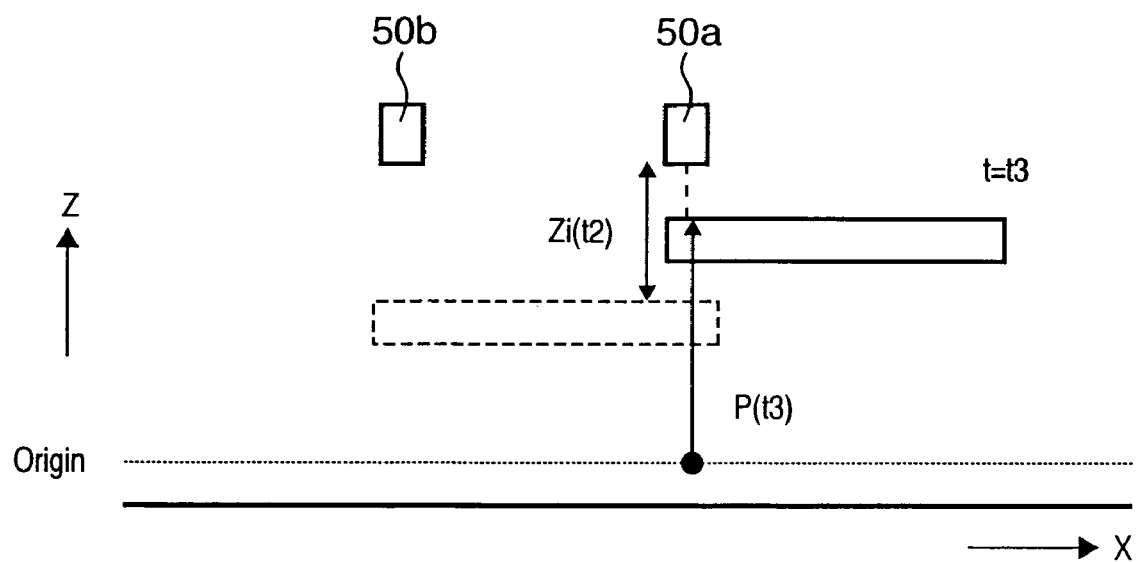

FIG. 3D schematically shows the top stage 27 at time (t=t3) driven to a position P(t3) after the interferometer switching. At this time, a position correction amount ΔP(t3) and a corrected position P(t3)' are expressed as follows.

$$\Delta P(t3)=k1*Zi(t2)+k2*(P(t3)-P(t2))k1=W(t3)-W(t2),$$
$$k2=Wi(t0)+W(t3),Zi(t2)=Zi(t0)-P(t2),P(t3)'=P(t3)+\Delta P(t3)$$

The value k1 is a relative value of the wavelength correction coefficient from time t2 to time t3, i.e., the time upon switching to the interferometer 50 to time t3. As the switching to the interferometer 50a means the resetting of the interferometer 50a, which has been previously disabled, the value is equivalent to that of the interferometer 50b at time t0. Accordingly, the relative value k1 with time t2 as a base point is necessary. Further, the value k2 is an absolute value of the wavelength correction coefficient at time t3. The value Zi(t2) is the optical path length at time t2, and the right side second term (P(t3)−P(t2)) is a driving amount from the time t2.

After time t3, when switching from the interferometer 50a to the interferometer 50b occurs, the wavelength correction may be performed in accordance with the above method. Thus, the wavelength correction can be correctly inherited upon interferometer switching.

For example, when switching from the interferometer 50a to the interferometer 50b has occurred at time t=t4, then the correction expression is as follows.

$$\Delta P(t5)=k1*Zi(t4)+k2*(P(t5)-P(t4))k1=W(t5)-W(t4),$$
$$k2=Wi(t0)+W(t5),Zi(t4)=Zi(t0)-P(t4),P(t5)'=P(t5)+\Delta P(t5)$$

Note that the mechanical butting, as shown in FIG. 3A, is performed when the interferometer 50b is operative. However, the butting may be performed when the interferometer 50a is inoperative.

Further, in the present embodiment, the X and Y positions upon switching are not defined. However, the X and Y positions may be any positions as long as they are within the overlap measurable range for the interferometers 50a and 50b. Further, the X and Y positions may be fixed positions. Note that in a case wherein switching is performed when the top stage 27 is driven at a high speed, it is preferable that the positions are set in consideration of switching time by resetting of the interferometer (or preset), calculation processing, and the like.

In the present embodiment, the interferometer for Z-directional measurement is mounted on the X stage. However, the interferometer may be mounted on the Y stage. Further, in the present embodiment, only one or two interferometer systems are provided on the top stage 27. However, the present invention is not limited to these numbers of interferometer systems, but three or more interferometer systems may be provided. In a case wherein measurement is performed in three positions, rotational information of the top stage 27 in the tilt direction (ωX and ωY), as well as the Z-directional displacement with the lens barrel support member 35 as a reference, can be obtained.

In the present embodiment, the present invention is applied to a wafer stage. However, the invention is also applicable to a reticle stage.

Further, the present invention is applicable to any system to perform interferometer changing in any direction, as well as in the Z-directional measurement.

[Device Fabrication Method]

Figure 5:
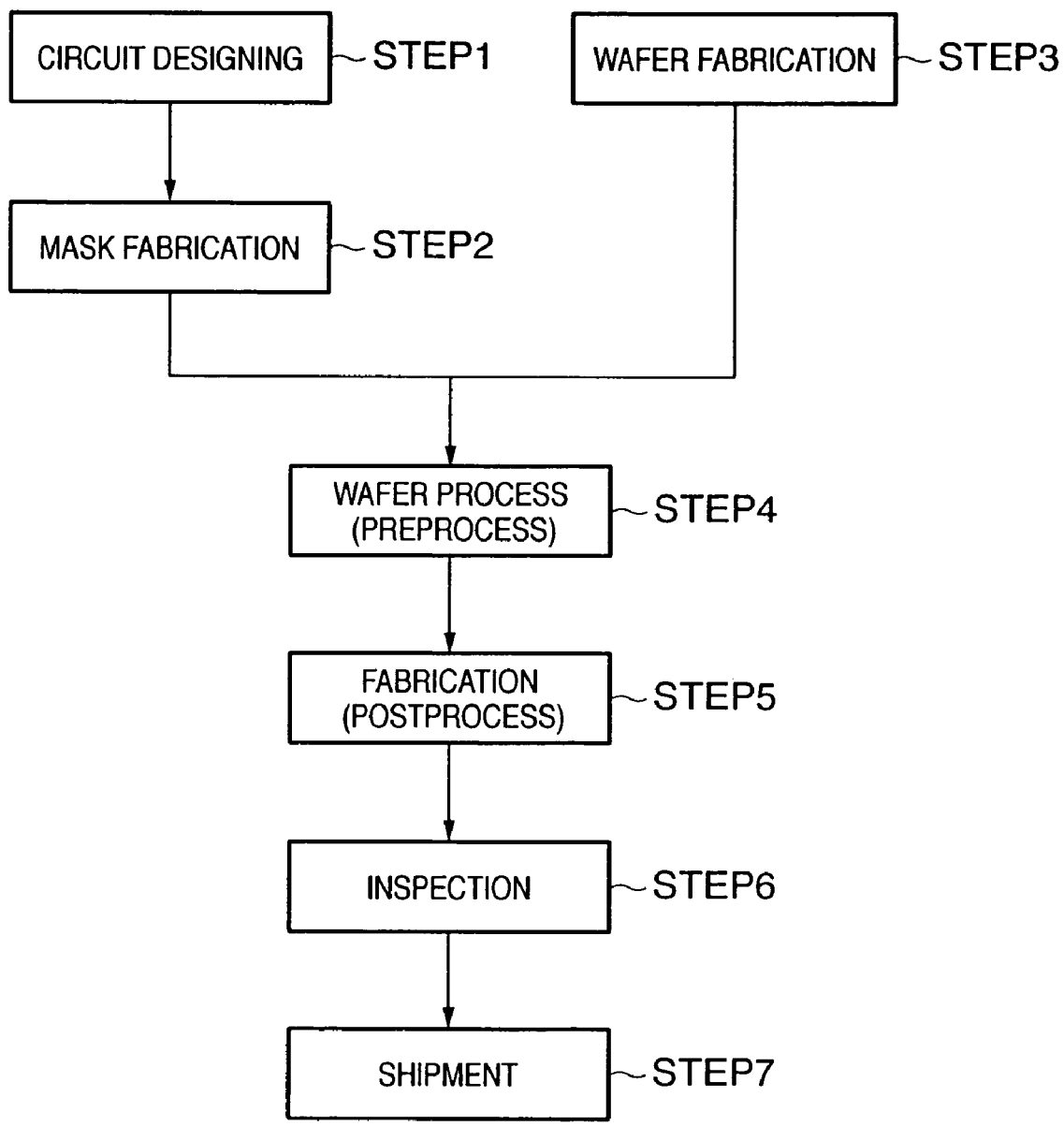
FIG. 5 is a flowchart showing a device fabrication method.
Figure 6:
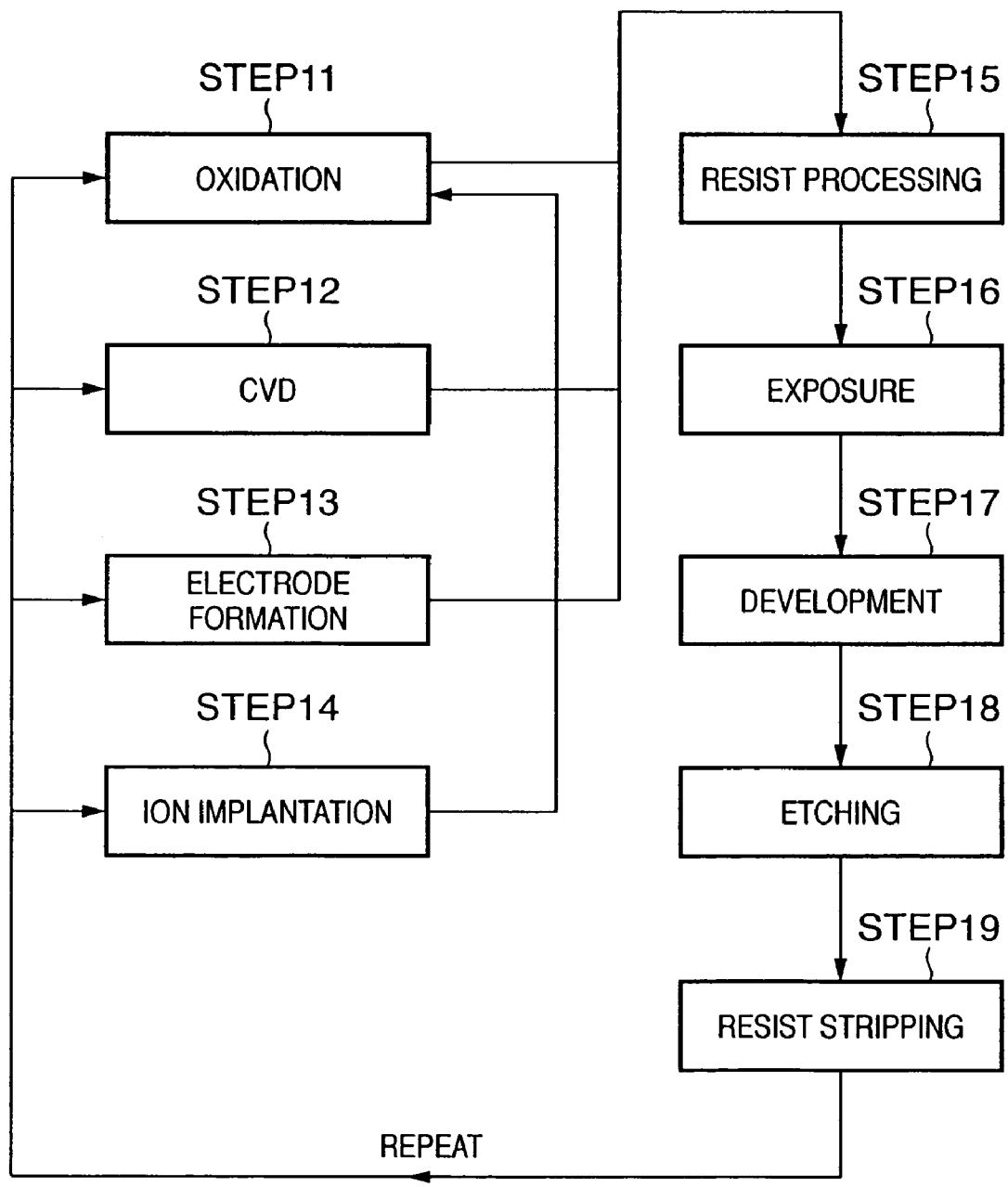
FIG. 6 is a flowchart showing a wafer process.

Next, a semiconductor device fabrication process utilizing the above exposure apparatus will be described. FIG. 5 shows a general semiconductor device fabrication flow. At step S1 (circuit designing), a circuit pattern of the semiconductor device is designed. At step S2 (mask fabrication), a mask is fabricated based on the designed circuit pattern.

On the other hand, at step S3 (wafer fabrication), a wafer is fabricated by using a material such as silicon. At step S4 (wafer process), called a preprocess, an actual circuit is formed on the wafer by the above-described exposure apparatus by a lithography technique using the above mask and wafer. At the next step, step S5 (fabrication), called a postprocess, a semiconductor chip is fabricated by using the wafer carrying the circuit formed at step S4. Step S5 includes an assembly process (dicing and bonding), a packaging process (chip encapsulation), and the like. At step S6 (inspection), inspections, such as an operation check, a durability test, and the like, are performed on the semiconductor device formed at step S5. The semiconductor device is completed through these processes, and is shipped at step S7.

The above wafer process at step S4 includes the following steps (FIG. 6), i.e., an oxidation step at which the surface of the wafer is oxidized, a CVD step at which an insulating film is formed on the surface of the wafer, an electrode formation step at which electrodes are formed by vapor deposition on the wafer, an ion implantation step at which ions are injected into the wafer, a resist processing step at which the wafer is coated with a photoresist, an exposure step at which the mask circuit pattern is exposure-printed on the wafer after the resist processing by the above-described exposure apparatus, a development step at which the wafer exposed at the exposure step is developed, an etching step at which portions other than the developed resist are removed, and a resist stripping step at which the resist, which is unnecessary after the completion of etching, is removed. These steps are repeated, to form multiple layers of circuit patterns on the wafer.

As many apparently widely different embodiments of the present invention can be made without departing from the spirit and scope thereof, it is to be understood that the invention is not limited to the specific embodiments thereof, except as defined in the claims.

CLAIM OF PRIORITY

This application claims priority from Japanese Patent Application No. 2004-304343, filed on Oct. 19, 2004, which is hereby incorporated by reference herein.

What is claimed is:

1. A stage apparatus comprising:
   a stage capable of moving an object;
   first and second measurement units, to measure a displacement of said stage in a predetermined direction based on a variation of an optical path length of measurement light, being arranged so as to have an overlap area to simultaneously measure a stage position while said stage is being moved;
   a switching unit to switch measurement by said first measurement unit to measurement by said second measurement unit by delivering a measurement value from said first measurement unit to said second measurement unit in said overlap area; and
   a correction unit, in the stage position upon switching by said switching unit, to correct a wavelength variation of the measurement light based on the measurement value delivered from said first measurement unit to said second measurement unit.

2. The stage apparatus according to claim 1, further comprising a first detection unit to detect the wavelength variation of said measurement light, wherein said correction unit obtains a first wavelength correction coefficient from a value detected by said first detection unit, and calculates a position correction amount for said stage based on the obtained first wavelength correction coefficient.

3. The stage apparatus according to claim 2, further comprising a second detection unit to detect at least one of an air pressure, a temperature and a humidity in a chamber containing said stage, wherein said correction unit obtains a second wavelength correction coefficient from a value obtained by said second detection unit, and calculates the position correction amount for said stage based on said first wavelength correction coefficient and said second wavelength correction coefficient.

4. A position measurement method for a stage apparatus having a stage capable of moving an object, and first and second measurement units to measure a displacement of the stage in a predetermined direction based on a variation of an optical path length of measurement light, being arranged so as to have an overlap area to simultaneously measure a stage position while the stage is being moved, said method comprising:

a switching step of switching measurement by the first measurement unit to measurement by the second measurement unit by delivering a measurement value from the first measurement unit to the second measurement unit in said overlap area;

a correction step of, in the stage position upon switching at said switching step, correcting a wavelength variation of the measurement light based on the measurement value delivered from the first measurement unit to the second measurement unit; and a measurement step of measuring a displacement of the stage in the predetermined direction based on the corrected wavelength variation of the measurement light while the stage is being moved.

5. The method according to claim 4, wherein the stage apparatus further has a first detection unit to detect the wavelength variation of the measurement light, wherein, at said correction step, a first wavelength correction coefficient is obtained from a value detected by the wavelength correction unit, and a position correction amount for the stage is calculated based on the obtained first wavelength correction coefficient.

6. The method according to claim 5, further comprising a second detection step of detecting at least one of an air pressure, a temperature and a humidity in a chamber containing the stage, wherein, at said correction step, a second wavelength correction coefficient is obtained from a value obtained at said second detection step, and calculates the position correction amount for the stage based on the first wavelength correction coefficient and the second wavelength correction coefficient.

7. An exposure apparatus for driving a stage carrying a substrate or an original plate using a stage apparatus, said stage apparatus comprising:

a stage capable of moving an object;

first and second measurement units, to measure a displacement of said stage in a predetermined direction based on a variation of an optical path length of measurement light, being arranged so as to have an overlap area to simultaneously measure a stage position while said stage is being moved;

a switching unit to switch measurement by said first measurement unit to measurement by said second measurement unit by delivering a measurement value from said first measurement unit to said second measurement unit in said overlap area; and a correction unit, in the stage position upon switching by said switching unit, to correct a wavelength variation of the measurement light based on the measurement value delivered from said first measurement unit to said second measurement unit.

8. A method of manufacturing a device, said method comprising the steps of:

exposing a substrate using an exposure apparatus having a stage apparatus comprising (i) a stage capable of moving an object, (ii) first and second measurement units, to measure a displacement of the stage in a predetermined direction based on a variation of an optical path length of measurement light, being arranged so as to have an overlap area to simultaneously measure a stage position while the stage is being moved, (iii) a switching unit to switch measurement by the first measurement unit to measurement by the second measurement unit by delivering a measurement value from the first measurement unit to the second measurement unit in the overlap area, and (iv) a correction unit, in the stage position upon switching by the switching unit, to correct a wavelength variation of the measurement light based on the measurement value delivered from the first measurement unit to the second measurement unit; and developing the substrate.

* * * * *